United States Patent [19]

Lam

[11] Patent Number: 5,177,863
[45] Date of Patent: Jan. 12, 1993

[54] METHOD OF FORMING INTEGRATED LEADOUTS FOR A CHIP CARRIER

[75] Inventor: Ken Lam, Colorado Springs, Colo.

[73] Assignee: Atmel Corporation, San Jose, Calif.

[21] Appl. No.: 859,079

[22] Filed: Mar. 27, 1992

[51] Int. Cl.$^5$ ............................................. H05K 3/36
[52] U.S. Cl. .......................... 29/830; 29/840;
174/254; 174/255; 174/261; 257/786; 361/412;
361/414
[58] Field of Search ............... 29/830, 827, 840, 846;
174/254, 255, 261; 361/398, 409, 412, 413, 414;
357/80

[56] References Cited

U.S. PATENT DOCUMENTS

| | | | |
|---|---|---|---|
| 4,288,841 | 9/1981 | Gogal | 361/414 |
| 4,426,773 | 1/1984 | Hargis | 361/412 X |
| 4,437,141 | 3/1984 | Prokop | 361/403 |
| 4,513,355 | 4/1985 | Sohroeder et al. | 357/80 X |
| 4,750,092 | 6/1988 | Werther | 29/830 X |
| 4,914,814 | 4/1990 | Behun et al. | 29/843 |
| 4,982,311 | 1/1991 | Dehaine et al. | 361/414 X |

Primary Examiner—Carl J. Arbes
Attorney, Agent, or Firm—Schneck & McHugh

[57] ABSTRACT

A method of forming leadouts on a surface mountable chip carrier for electrical connection to a supporting substrate, such as a motherboard. The chip carrier includes a carrier board having input/output vias extending to a selected layer of the carrier board. In a preferred embodiment, the selected layer is the lower surface of the carrier board, but the selected layer may optionally be the upper surface or an intermediate layer. The input/output vias are on an inboard side of an interconnection region. An array of terminals, which may also be vias, are on the outboard side of the interconnection region. The interconnection region is removed from the carrier board to form a window located between the terminals and the input/output vias. In the preferred embodiment, a metallic layer is then deposited on the lower surface of the carrier board. The metallic layer is patterned to leave leads extending from the input/output vias to the terminals, thereby providing parallel leads extending across the window. The portion of the leads exposed by the window provides contact sites to be bonded to contact sites of the supporting substrate. Preferably, a number of windows are formed. The portion of the carrier board that is outboard of the windows may optionally be removed to form cantilevered input/output leads of a leaded chip carrier.

17 Claims, 2 Drawing Sheets

5,177,863

METHOD OF FORMING INTEGRATED LEADOUTS FOR A CHIP CARRIER

TECHNICAL FIELD

The present invention relates generally to carriers for integrated circuit chips and more particularly to interconnection of a chip carrier to a supporting substrate such as a motherboard.

BACKGROUND ART

In many applications semiconductor integrated circuit chips are mounted to chip packages which are then connected to a motherboard having a number of chip packages. Thus, there are two levels of interconnection. In the first level, one or more integrated circuit chips are electrically connected to the package. Common techniques for achieving the chip-to-package interconnection include wire bonding, flip-chip processing and tape automated bonding.

The second level of interconnection provides electrical connection between the chip package and the motherboard. The most common packages are dual-in-line packages (DIP), pin-grid array packages, leadless chip carriers, and leaded chip carriers. DIP packages have leads that extend from the sides of the package for insertion into throughholes in the motherboard. The leads are then soldered to form interconnection points between the DIP package and the motherboard. Such packages are satisfactory for leadouts of up to approximately eighty leads. Pin-grid packages provide a higher lead density, since the pins are placed in a regular x-y array along a major surface of the pin-grid package.

A leaded chip carrier typically includes a carrier board onto which one or more chips are mounted. The second level of interconnection, i.e. the package-to-motherboard connection, then entails linking contact sites on the carrier board to contact sites on the motherboard. This can be achieved by using the same techniques as those used at the chip-to-package interconnection level. That is, second level interconnection schemes include wire bonding miniature wires and include tape automated bonding a frame of leads from contact sites on the carrier board to contact sites on the motherboard. The connection of the miniature wires or the frame of leads increases the cost of chip carrier fabrication. Moreover, misalignment of the wires or leads and improper soldering of the individual leads often result in defective operation of the resulting device. Thus, the second level interconnect members affect reliability and fabrication yield.

Leadless chip carriers are known, but often include cost-inefficient fabrication steps for exposing contact sites on the chip carrier for solder connection to contact sites on the motherboard. For example, conductors may be formed within grooves extending vertically along the edges of the chip carrier substrate for solder connection to the motherboard.

It is an object of the present invention to provide a method of forming leadouts on a surface mountable chip carrier for electrical interconnection to a supporting substrate such as a motherboard, wherein testing, reliability and yield are enhanced and cost is reduced.

SUMMARY OF THE INVENTION

The above object has been met by a method of forming leadouts on a surface mountable chip carrier using only standard printed circuit board fabrication techniques. A chip carrier board is fabricated to comprise a number of layers, including a patterned metallization layer which functions not only to provide horizontal electrical connections along the chip carrier board, but also to provide input/output leads to a motherboard. The input/output leads cross windows formed through the chip carrier board, so that an end user may select between removing the portion of the board that extends beyond the window to provide cantilevered input/output leads or leaving the chip carrier board intact for attachment in the same manner as a leadless chip carrier.

The chip carrier board is preferably made of material conventionally used in the manufacture of printed circuit boards and the metallization layer that is patterned to form the input/output leads is preferably a bottom layer. Prior to formation of the bottom layer, standard board fabrication techniques are employed to provide an array of vias that extend to a lower surface of the chip carrier board. The vias may pass entirely through the chip carrier board or may extend from a center metallization layer to the lower surface. The vias are disposed at an inboard side of the window.

A metallization layer is then deposited on the lower surface of the chip carrier board. Standard printed circuit board techniques are again utilized to pattern the metallization layer, leaving traces that extend from the vias to terminals that are outboard of the windows. The traces are patterned to extend across the window. The portions of the traces exposed at the windows are used as input/output leads. The input/output leads may then be bonded to contact sites of the motherboard.

The chip carrier board may be used as a leadless chip carrier by bonding the exposed portions of the traces to the contact sites of the motherboard. Where desired, a leaded chip carrier can be provided by removing the edge of the chip carrier board beyond the window. This frees the outer lead ends of the input/output leads for connection in the same manner as a tape automated bonding frame. Particularly where the edge of the chip carrier board is to be removed, the metallization layer that forms the input/output leads may be a center or even a top layer of the chip carrier board.

In a preferred embodiment, the terminals that are outboard of the windows include vias to the top of the chip carrier board. The vias can then be used as test sites. In this preferred embodiment the chip carrier board includes a window proximate to each edge of the board, thereby allowing a greater number of input/output leads.

An advantage of the present invention is that a printed circuit board metallization layer acts a the leadout, eliminating any requirement of solder attachment of a tape automated bonding frame or the like to a metallization pattern. By eliminating the requirement of solder attachments prior to mounting of the chip carrier to a motherboard, reliability and fabrication yield are improved. Another advantage is that the test vias provide stable sites for connection of probes without damage to fragile leads. Another advantage is that fabrication of a chip carrier by use of the present invention allows a user to select between a leadless and a leaded chip carrier.

BEST MODE FOR CARRYING OUT THE INVENTION

Figure 1:
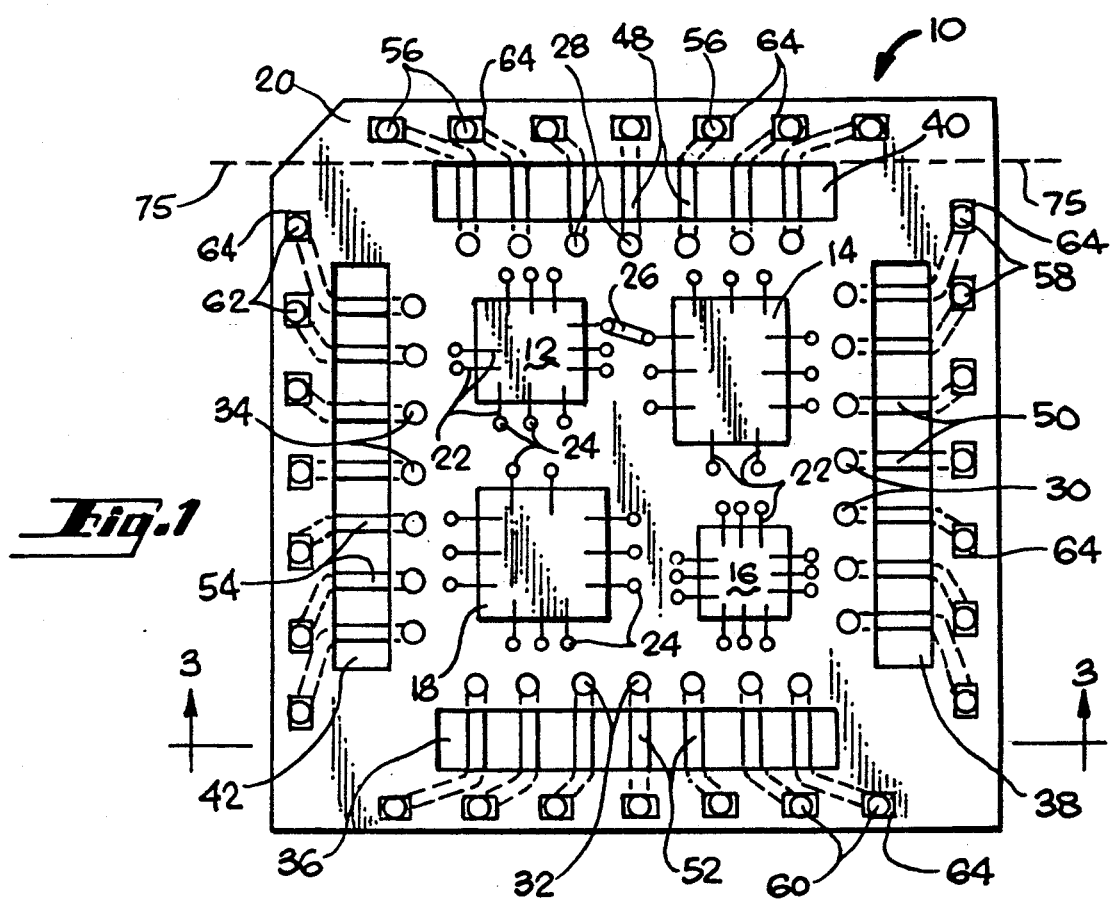
FIG. 1 is a top view of a chip carrier fabricated in accord with the present invention.

With reference to FIG. 1, a chip carrier 10 is shown as including four integrated circuit chips 12, 14, 16 and 18 mounted on a chip carrier board 20. Wire bonds 22 extend from input/output pads on the integrated circuit chips to vias 24 of the carrier board 20. The vias 24 are throughholes having a plating of conductive materials to the bottom surface of the carrier board or to a center conductive layer of the carrier board. The use of wire bonds is not critical, since other techniques for connecting the chips 12-18 to the carrier board 20 (e.g., surface mounting) are known.

Prior to formation of a bottom conductive layer, fabrication of the chip carrier board 20 utilizes only standard printed circuit board processing techniques. Vertical electrical connections are made by the plated throughholes that form the vias 24. Methods of forming conductive vias are well known in the art. Horizontal electrical connections are made by patterning one or more layers of metallization to form traces. A signal trace 26 is shown on the top surface of the carrier board 20 in FIG. 1 to allow electrical connection between the integrated circuit chip 12 and the integrated circuit chip 14. Photolithographical techniques are commonly used to etch away selected portions of a metal foil, leaving desired signal traces. The pattern of signal traces is typically more complex than that shown in FIG. 1, but for purposes of illustration the number of signal traces and the number of wire bonds from the integrated circuit chips 12-18 have been reduced.

Figure 2:
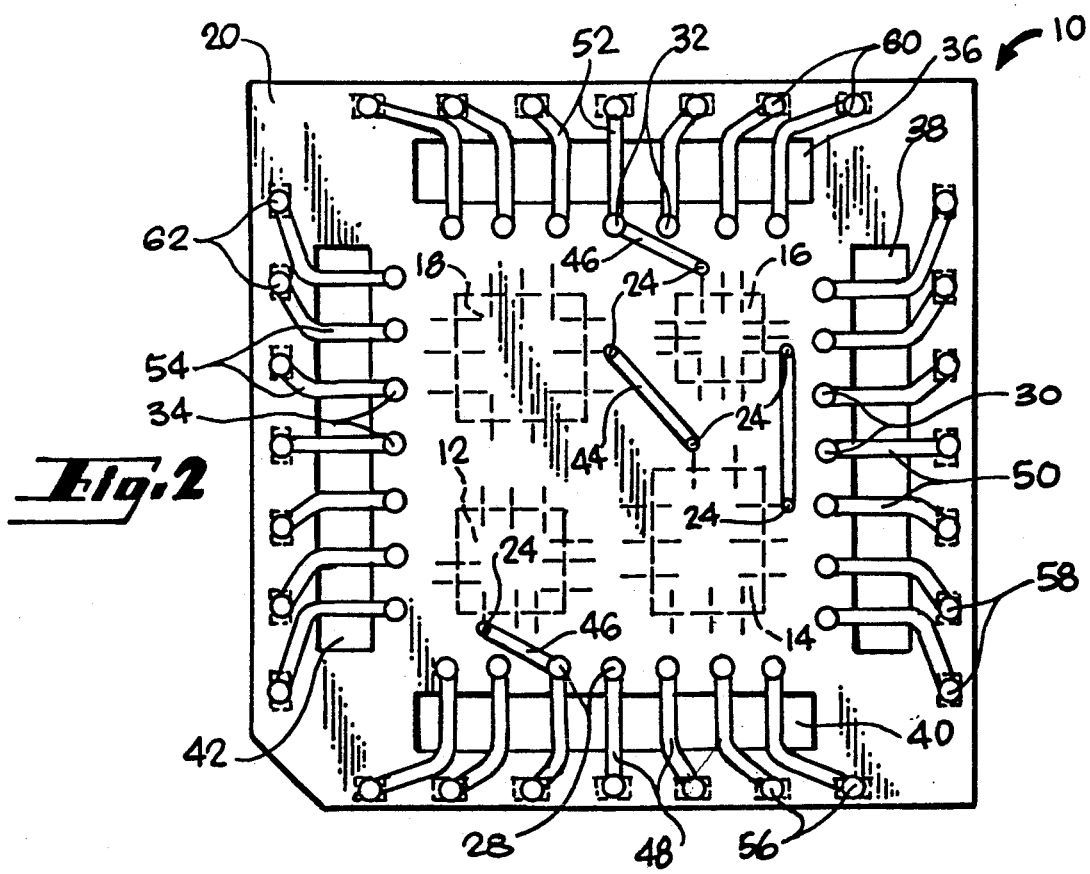
FIG. 2 is a bottom view of the chip carrier of FIG. 1.

In addition to the vias 24 that receive the wire bonds 22 from the integrated circuit chips 12-18, the chip carrier board 20 is fabricated to include four arrays of input/output vias 28, 30, 32 and 34. The input/output vias may extend from the upper surface of FIG. 1 to the bottom surface shown in FIG. 2. Alternatively, the vias may originate at a center metallization layer of the chip carrier board 20 and extend to the bottom surface.

The arrays of input/output vias 28-34 are typically formed prior to the removal of regions of the chip carrier board 20 to create four windows 36, 38, 40 and 42 that are outboard of the arrays. The removal of the board material to form the windows may be by any method known in the art. For example, the material may be removed by a punch or by a routing tool. As noted, the windows are outboard of the input/output vias and cannot be through portions of the chip carrier board that include signal traces either on the upper layer or any center layer. While the input/output vias are shown as being aligned with the inner edges of the windows 36-42, the alignment of the input/output vias is not critical. In fact, the vias 24 which receive the wire bonds 22 may act as the input/output vias if the wire bond vias 24 extend to the bottom surface of the chip carrier board 20.

After board material has been removed to provide the windows 36-42, a layer of conductive material is formed on the bottom surface of the chip carrier board 20. This conductive layer is preferably copper. The conductive layer is then patterned to form the horizontal connections shown in FIG. 2. These horizontal connections include signal traces 44 that connect two wire bond vias 24, signal traces 46 that connect a wire bond via 24 to an input/output via 28 and leads 48, 50, 52 and 54 that extend from the input/output vias 28-34 to the outboard side of the windows 36-42.

One method of forming the signal traces 44 and 46 and the leads 48-54 is to secure a copper foil to the bottom surface of the chip carrier board 20, so that the foil can be patterned while in place. Preferably, the windows 36-42 are first prepared with a coating of material that can be easily stripped away after patterning of the copper foil. Coating the windows provides support for the copper during the patterning procedure.

The patterning of the copper foil may be performed by conventional photolithographical techniques. Selected portions of the copper lamination are etched away to leave the signal traces 44 and 46 and the leads 48-54. Optionally, a plurality of identical chip carrier boards 20 can be fabricated from a single large board, whereafter the individual chip carrier boards can be diced in the same manner as integrated circuit chips are fabricated from a semiconductor wafer.

Beyond the outboard edges of the windows 36-42 are terminals that secure the outer lead ends of the leads 48-54. Here, the terminals are test vias 56, 58, 60 and 62. The test vias extend to the upper surface of the chip carrier board 20. The upper surface of the chip carrier board includes test pads 64 for connection to test equipment probes utilized to determine whether the board operates properly. Such testing can take place either prior or subsequent to connection to a motherboard.

Figure 3:
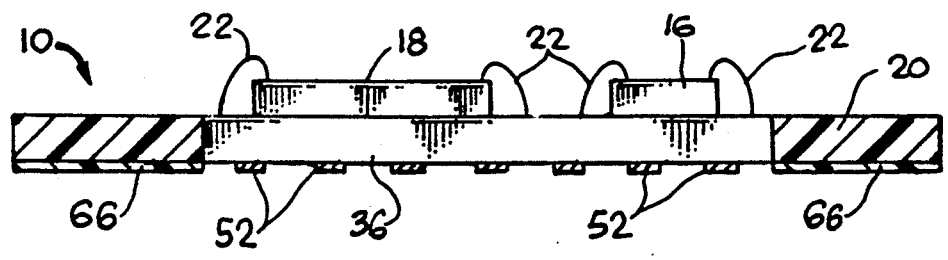
FIG. 3 is a side view of the chip carrier of FIG. 1, taken along lines 3—3.

Referring now to FIGS. 1 and 3, each lead 48-54 has a portion which is exposed by a window 36-42. The exposed portion of each lead functions as a connection site for solder attachment to a contact site on a motherboard or the like. The chip carrier 10 is a surface mountable device. To protect against electrical shorting between the chip carrier and a motherboard, a film of solder resist 66 is deposited on the bottom surface of the chip carrier board 20. The solder resist is a dielectric material that isolates signal traces and vias on the chip carrier board from conductive elements of a motherboard.

Figure 4:
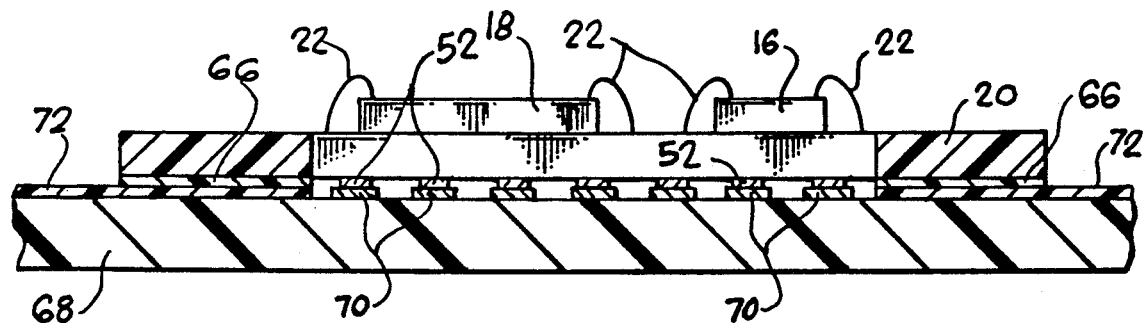
FIG. 4 is a side sectional view of the chip carrier of FIG. 3 electrically interconnected to a supporting substrate.

FIG. 4 shows the connection of the chip carrier board 20 to a supporting substrate. Here, the supporting substrate is a motherboard 68. The motherboard includes a pattern of contact sites 70 corresponding to the pattern of leads 52. The contact sites 70 are shown as being somewhat larger than the leads 52. The difference in size permits a misalignment of the leads 52 without adversely affecting the electrical communication between the chip carrier and the motherboard. Like the chip carrier board 20, the motherboard 68 includes a film of solder resist 72 to prevent electrical shorts.

Returning to FIG. 1, after the leads 48-54 have been formed and any subsequent testing has been completed, optionally a user may remove the peripheral portion of the chip carrier board 20. Dashed line 74 illustrates a removal line. The leads should be severed to provide a cantilevering of the leads from the remaining portion of the chip carrier board. The cantilevered leads can then be used as contact sites in the same manner as the leads of a tape automated bonding frame. Thus, the user has the option of employing the chip carrier 10 as a leadless device or a leaded device.

While the present invention has been described and illustrated as having more than one integrated circuit chip 12-18, the chip carrier 10 may be of the type that contains a single chip. Advantages of the present invention include the elimination of leads that must be soldered to the chip carrier for attachment to the motherboard. Thus, reliability is improved and fabrication cost is reduced. Moreover, the patterning of leads 48-54 as described above allows a higher density of leads than is typically possible where solder attachment is required. The test pads 64 allow connection of test equipment without jeopardizing the alignment of the portion of the leads exposed by the windows 36-42.

Figure 5:
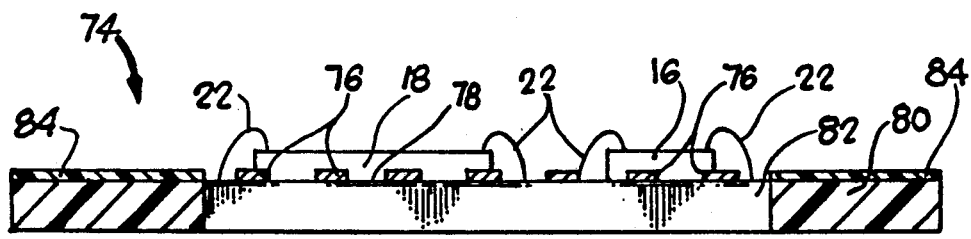
FIG. 5 is a side sectional view of a second embodiment of a chip carrier fabricated in accord with the present invention.

Referring to FIG. 5, a second embodiment of a chip carrier 74 fabricated in accord with the present invention is illustrated. In this embodiment, input/output leads 76 are fabricated in the same manner as described above, but the patterned leads 76 are on the upper surface 78 of a chip carrier board 80. The leads extend across a window 82 that is structurally and functionally identical to the ones described above with reference to bottom surface leads.

The leads 76 are typically connected to contact sites of a motherboard in the same manner as outer lead ends of a tape automated bonding frame. That is, cantilevered outer lead ends are electrically attached to traces or pads of a motherboard. The outermost edge of the chip carrier board 80 is severed, allowing the leads 76 to extend beyond the edge of the window 82. The leads 76 may be deformed downwardly to contact the motherboard. Because the motherboard is at the bottom surface of the chip carrier board 80, a film 84 of solder resist is less important than in the first embodiment described above.

Where the chip carrier board 80 is a thin board, it may be possible to attach the input/output leads 76 to contact sites of a motherboard without severing the edge of the chip carrier board. In this manner, the chip carrier 74 of FIG. 5 may be used as a leadless chip carrier. This is also possible if the contact sites of the motherboard to which the chip carrier are to be attached are raised to a height that allows attachment of the leads 76 without excessive bending of the leads.

Figure 6:
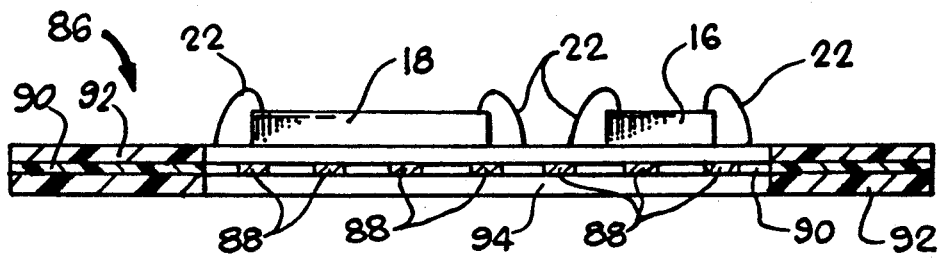
FIG. 6 is a side sectional view of a third embodiment of a chip carrier fabricated in accord with the present invention.

A third embodiment of a chip carrier 86 is shown in FIG. 6. In this embodiment input/output leads 88 are fabricated within an intermittent layer 90 of a chip carrier board 92. Compared to the embodiment of FIG. 5, the input/output leads 88 may more easily be connected to contact sites of a motherboard without exerting undue stress on the individual leads. However, in the same manner as the embodiments above, a portion of the board 92 beyond a window 94 may be severed to form a leaded chip carrier having cantilevered input/output leads 88.

What is claimed is:

1. A method of forming leadouts on a surface mountable chip carrier for electrical interconnection of said chip carrier with contact sites of a supporting substrate comprising, providing a chip carrier board having an array of vias extending to a first surface of said chip carrier board, said chip carrier board having a via-free interconnection region which is to be aligned with said contact sites of said supporting substrate, removing said interconnection region, thereby forming a window through said chip carrier board, forming a layer of electrically conductive material on said first surface of said chip carrier board, and patterning said conductive layer to leave traces extending from said vias to a first window edge and across said window to a second window edge opposite to said first window edge, thereby forming a pattern of leads across said window for connection to said contact sites of said supporting substrate, whereby a chip carrier is provided which can be electrically attached to said supporting substrate without requirement of attachment of intermediate leads from said chip carrier to said supporting substrate.

2. The method of claim 1 wherein said step of patterning said conductive layer includes photolithographically removing selected portions of said conductive layer.

3. The method of claim 1 further comprising bonding leads to said contact sites of said supporting substrate.

4. The method of claim 1 further comprising forming a plurality of windows adjacent to edges of said chip carrier board and forming leads across each of said windows.

5. The method of claim 1 wherein said step of patterning said conductive layer includes forming said leads to extend across said window and to terminate at test vias adjacent to an edge of said chip carrier board.

6. The method of claim 1 further comprising removing the portion of said chip carrier board opposite to said first window edge after said step of patterning, thereby cantilevering said leads from said chip carrier board.

7. The method of claim 1 further comprising attaching integrated circuit chips onto said chip carrier board on a surface opposite to said leads.

8. A method of forming input/output leads to act as a pattern of contact sites for attachment of a chip carrier to a corresponding pattern of contact sites on a printed circuit board comprising, providing a carrier board having an upper surface to receive an integrated circuit component and having a lower surface having terminals for the conduction of input/output signals in the operating of said integrated circuit component, forming a window through said carrier board in a direction perpendicular to said upper and lower surfaces, and forming input/output leads on said lower surface from said terminals to extend in a generally parallel fashion across said window for solder attaching to said contact sites on said printed circuit board.

9. The method of claim 8 further comprising forming a metallic layer on said lower surface and wherein said step of forming input/output leads includes photolithographically removing selected portions of said metallic layer.

10. The method of claim 9 wherein said step of forming a metallic layer includes depositing copper on said lower surface.

11. The method of claim 8 further comprising removing a peripheral portion of said carrier board after said step of patterning, said step of removing causing cantilevering of said input/output leads from said carrier board.

12. A method of forming leadouts on a chip carrier for electrical interconnection of said chip carrier with a supporting substrate comprising, fabricating a chip carrier board to include an array of input/output vias extending to a major surface of said chip carrier board and to include an array of terminals proximate to an edge of said major surface, forming a window through said chip carrier board at a region between said terminals and said input/output vias, forming a metallic layer on said major surface of said chip carrier board, removing selected portions of said metallic layer and leaving traces extending from said input/output vias to said terminals, said traces thereby having a pattern of exposed portions at said window, providing a motherboard having a pattern of contact sites corresponding to said pattern of exposed portions, and bonding said exposed portions of said traces to said contact sites of said motherboard.

13. The method of claim 12 wherein said major surface is a lower surface and wherein said step of fabricating a chip carrier board includes forming plated vias from said terminals to an upper surface of said chip carrier board, thereby providing test pads at said upper surface.

14. The method of claim 12 further comprising forming a plurality of windows through said chip carrier board, said step of removing selected portions of said metallic layer including leaving traces extending across each of said windows.

15. The method of claim 12 further comprising removing the portion of said chip carrier board having said array of terminals, thereby leaving said traces cantilevered from said chip carrier board.

16. The method of claim 12 further comprising soldering at least one integrated circuit onto said chip carrier board.

17. The method of claim 12 wherein said step of bonding said exposed portions of said traces to said contact sites includes reflowing solder.

* * * * *